United States Patent [19]
Pham

[11] Patent Number: 6,081,419
[45] Date of Patent: Jun. 27, 2000

[54] PROTECTION DEVICE FOR AN ELECTRONIC INSTRUMENT AND METHOD

[75] Inventor: Hoa Pham, San Jose, Calif.

[73] Assignee: Cisco Technology, Inc., San Jose, Calif.

[21] Appl. No.: 09/128,991

[22] Filed: Aug. 3, 1998

[51] Int. Cl.[7] .................................................. H02B 1/08
[52] U.S. Cl. ...................... 361/617; 361/683; 361/616; 361/725; 439/347; 439/158; 439/159; 301/31; 174/50
[58] Field of Search ..................................... 361/683, 686, 361/695, 644, 616, 617, 684, 24, 707, 725, 832, 796, 732, 609; 439/347, 299, 159, 138; 200/50.1; 307/31; 174/50

[56] References Cited

U.S. PATENT DOCUMENTS

| | | |
|---|---|---|
| 4,160,247 | 7/1979 | Laughlin et al. ...................... 340/693 |
| 4,387,951 | 6/1983 | Hall et al. ............................. 361/683 |
| 4,750,136 | 6/1988 | Arpin et al. .......................... 364/514 |
| 5,115,431 | 5/1992 | Williams et al. ..................... 370/94.1 |
| 5,224,099 | 6/1993 | Corbalis et al. ...................... 370/94.2 |
| 5,386,567 | 1/1995 | Lien et al. ............................ 395/700 |
| 5,491,687 | 2/1996 | Christensen et al. ................. 370/17 |
| 5,834,925 | 11/1998 | Chesavage ........................... 323/272 |

*Primary Examiner*—Leo P. Picard
*Assistant Examiner*—Michael Datskovsky
*Attorney, Agent, or Firm*—D'Alessandro & Ritchie

[57] ABSTRACT

A protection device for an electronic instrument having a power supply, a power cord for attachment to the power supply, and an interlock member being movable between a first position preventing attachment of the power cord to the power supply, and a second position permitting attachment of the power cord to the power supply.

18 Claims, 6 Drawing Sheets

PROTECTION DEVICE FOR AN ELECTRONIC INSTRUMENT AND METHOD

BACKGROUND OF THE INVENTION

1. Field of the Invention

The present invention relates to power supplies, and more particularly for protection of an electronic instrument from the power supply.

2. The Background

The use of power supplies for providing power to an electronic equipment or instruments is well known. Such power supplies commonly have a power cord, such as a standard IEC-type cord, removably attached to the power supply for providing power to the power supply. Commonly, a rear face of the power supply is provided with electrical connectors which may be removably attached to corresponding connectors on a back plane of the electronic instrument in order to supply power to the electronic instrument.

It is also known that the power supply must not generate power while it is being attached to or removed from the back plane of the instrument, since such connection and removal while powered may cause arcing of the assembly, which may result in damage to the electronic instrument and/or to the power supply.

The simple solution to this problem is, of course, either to turn a power switch off on the power supply, or to remove the power cord from the power supply, after which the power supply may be safely attached to or removed from the back plane without a problem. However, the connection and detachment of the power supply may be done by an operator of the equipment who is unfamiliar with this procedure, or unwilling to comply with it, and thus may attach or disconnect the power supply with the power supply in full operation. In addition, an operator may be handling the equipment who is familiar with this procedure, but who inadvertently attaches or removes the power supply while it is operating. Hence, it would be desirable to make it impossible to attach or remove to the power supply to or from the back plane while the power supply is generating power in order to prevent this result.

BRIEF DESCRIPTION OF THE INVENTION

A protection device for an electronic instrument is provided in accordance with the present invention. The device has a power supply, and a power cord for attachment to the power supply to supply power to the power supply. The protection device also has an interlock member which is movable between a first position preventing attachment of the power cord to the power supply, and a second position permitting attachment of the power cord to the power supply. In addition, the same interlock member prevents connection of the power supply to the electronic instrument when the power cord is attached to the power supply, as well as removal of the power supply from the electronic instrument when the power cord is attached to the power supply.

FEATURES AND ADVANTAGES OF THE INVENTION

A principal feature and advantage of the present invention is the provision of a protection device for an electronic instrument.

Another feature and advantage of the invention is the provision of an interlock member which is movable between a first position which prevents attachment of a power cord to a power supply, and a second position which permits attachment of a power cord to the power supply.

Thus, a feature and advantage of the invention is that the interlock member automatically assures that power is removed from the power supply when the power supply is attached to and removed from the electronic instrument.

Another feature and advantage of the invention is that the interlock member may be utilized to secure the power supply to a frame of the electronic instrument after the power supply has been safely attached to the electronic instrument.

A further feature and advantage of the invention is that the interlock member prevents the securing of the power supply to the frame until the power supply has been safely and completely attached to the electronic instrument.

Another feature and advantage of the present invention is that the interlock member prevents damage to the electronic instrument by the power supply during attachment of and removal from the electronic instrument.

Still another feature and advantage of the present invention is that the interlock member is of simplified construction and reduced cost.

These and many other features and advantages of the present invention will become apparent to those of ordinary skill in the art from a consideration of the drawings and ensuing description of the invention.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
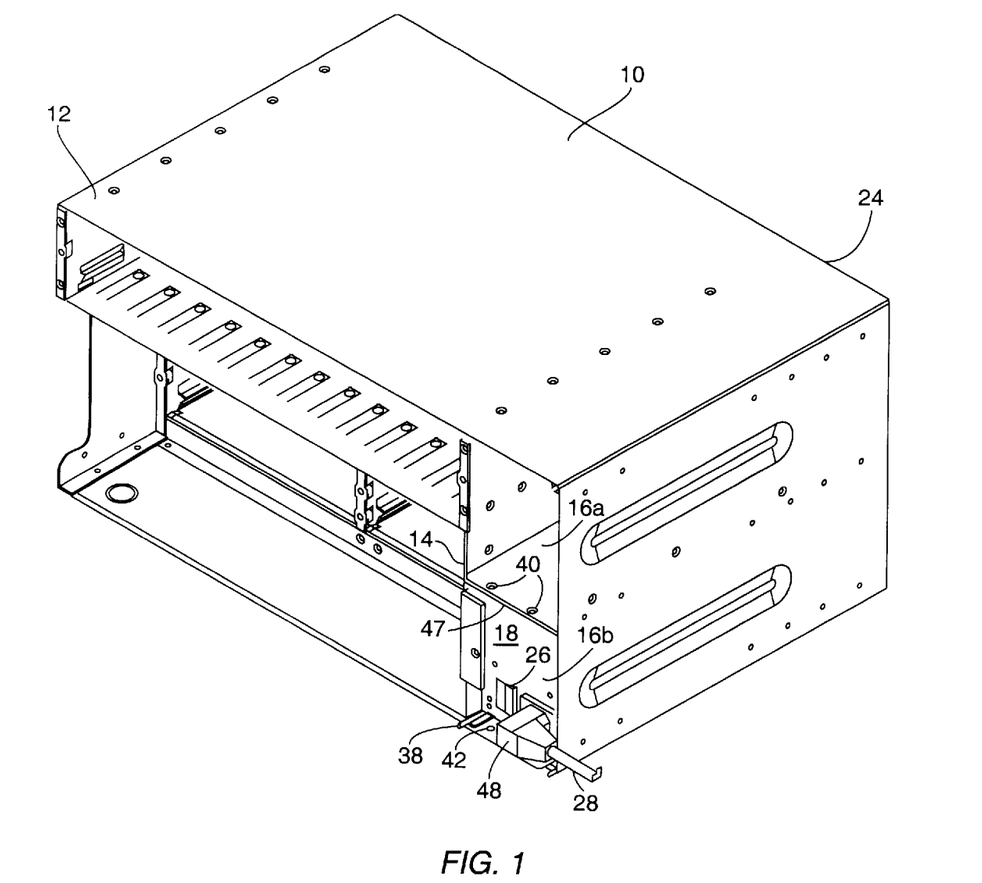
FIG. 1 is a perspective view of a power supply disposed in a housing for an electronic instrument.
Figure 6:
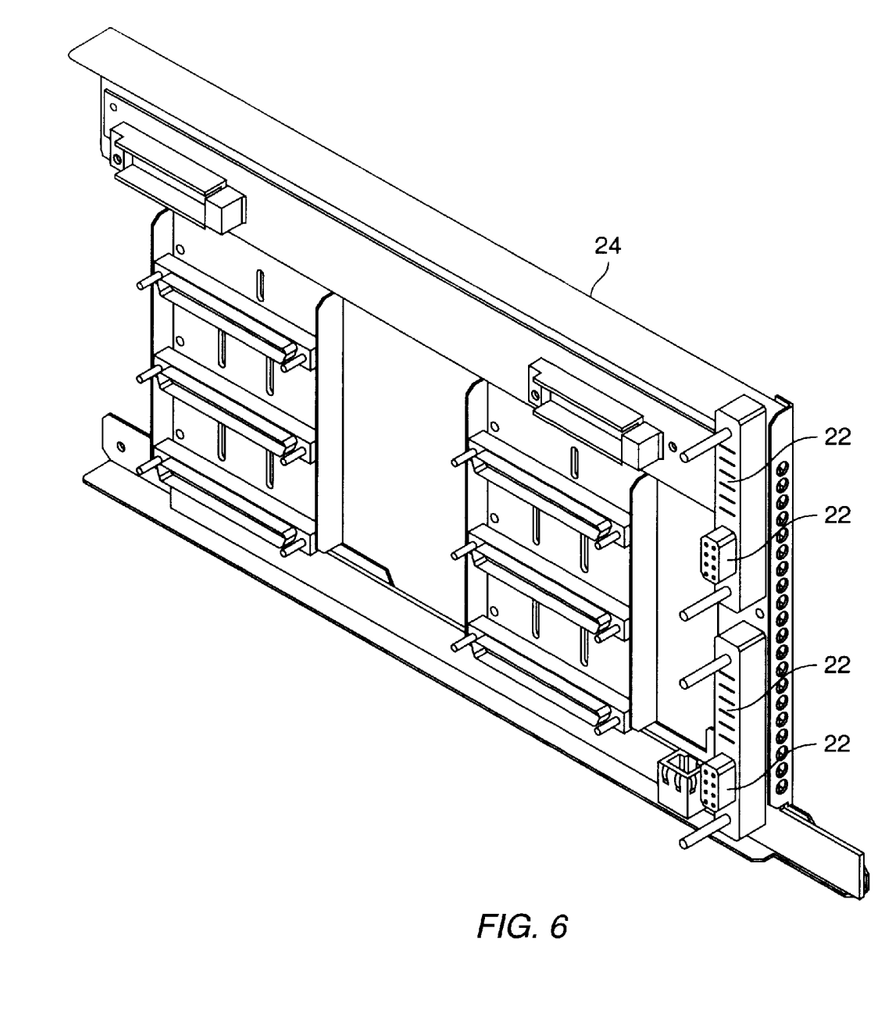
FIG. 6 is a perspective view of a back plane of an electronic instrument.

Referring now to FIG. 1, there is shown an electronic instrument 10 having a frame or chassis 12. The frame 12 has a plurality of walls 14 defining a pair of cavities 16a, 16*b*, each adapted to receive a power supply 18, as shown inserted into the lowermost cavity 16*b*. Another power supply 18 may be received in the uppermost cavity 16 for the purpose of providing a dual redundant power supply as well known in the art. When the power supplies 18 are fully received in the corresponding cavities 16*a*,16*b*, connectors 20 (shown in FIGS. 2, 3, 4, and 5), such as male and/or female connectors of the power supply 18, are removably attached to corresponding connectors 22 on a back plane 24 of the electronic instrument 10, as shown in FIG. 6.

When the power supply 18 is turned on by an optional power switch 26, it supplies power to the electronic instrument 10 through the connectors 20 and 22 of the power supply 18 and back plane 24, respectively. The power supply 18 also has a power cord 28 to supply suitable power to power supply 18, as shown in FIG. 1. However, it is necessary to remove power from power supply 18 when it is attached to back plane 24, and when it is removed from back plane 24. If this procedure is not followed, then the power supply 18 may cause arcing between connectors 20 and 22 of power supply 18 and back plane 24 which may cause damage to the electronic instrument 10 or to the power supply.

The simple manner in which to prevent this result is to turn off the power switch 26 when the power supply 18 is attached to or removed from the back plane 24 of the electronic instrument 10, or remove the power cord 28 from the power supply 18 at this time. However, the attachment and removal procedure for power supply 18 may be carried out by an operator of the system who is either not familiar with this procedure, or who may inadvertently (or deliberately) fail to follow the necessary procedure. Thus, it is desired to automatically prevent the possibility that the power supply 18 is attached to and removed from the back plane 24 while the power supply 18 is powered.

This result is accomplished in a simplified manner by an interlock member generally designated 30 of the present invention. As shown in FIGS. 2–5, 7, and 8, the interlock member 30 has a hollow sleeve 32, and a hollow movable cap 34 positioned on the sleeve 32, with the cap 34 being attached to an inner threaded screw 36 which is received in the sleeve 32. Such devices are known as thumb screws, and are available from, for example, South Co. Of Concordville, Pa., and are normally used, for example, to hold panels to rack-type enclosures. It is contemplated, however, that other devices may be used for this purpose, which work in different orientations of the devices. The power supply 18 has a lower front plate 38 on which the sleeve 32 is fixedly mounted, with the corresponding screw 36 being aligned with a threaded bore 40 of the frame 12. The plate 38 also has a corresponding bore or opening 42 to permit passage of the screw 36 through the plate 38, with the bore 42 being aligned with the threaded bore 40 of the frame 12 when the power supply 18 is fully received in the cavity 16 where the power supply 18 is attached to the electronic instrument 10.

Figure 2:
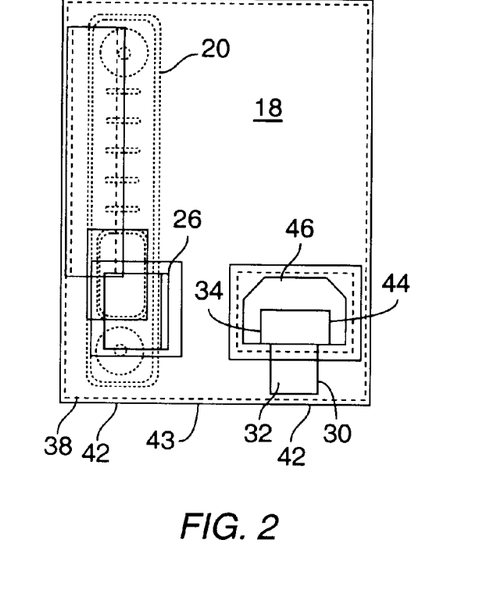
FIG. 2 is a front elevational view of a power supply showing an interlock member in a first position in accordance with a presently preferred embodiment of the present invention.

As shown in FIG. 2, the interlock member 30 has a helical spring 44 received in the cap 34, and bearing upon an outer end of the sleeve 32, such that the spring 44 biases the cap 34 away from an outer end of the sleeve 32 while co-operating flanges of the cap 34 and sleeve 32 prevent full removal of the cap 34 from the sleeve 32.

Figure 3:
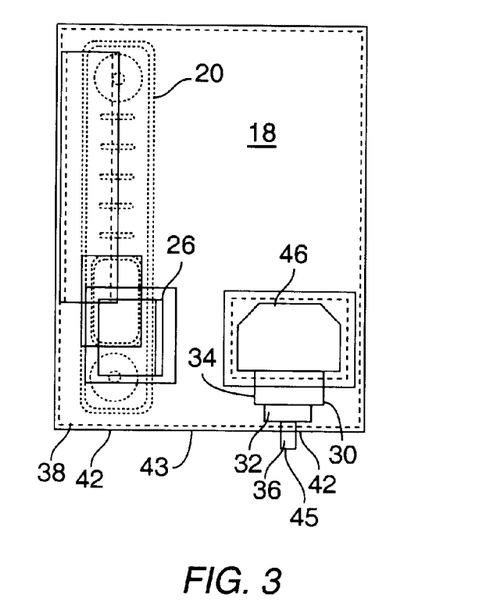
FIG. 3 is a front elevational view of a power supply showing an interlock member in a second position in accordance with a presently preferred embodiment of the present invention.
Figure 4:
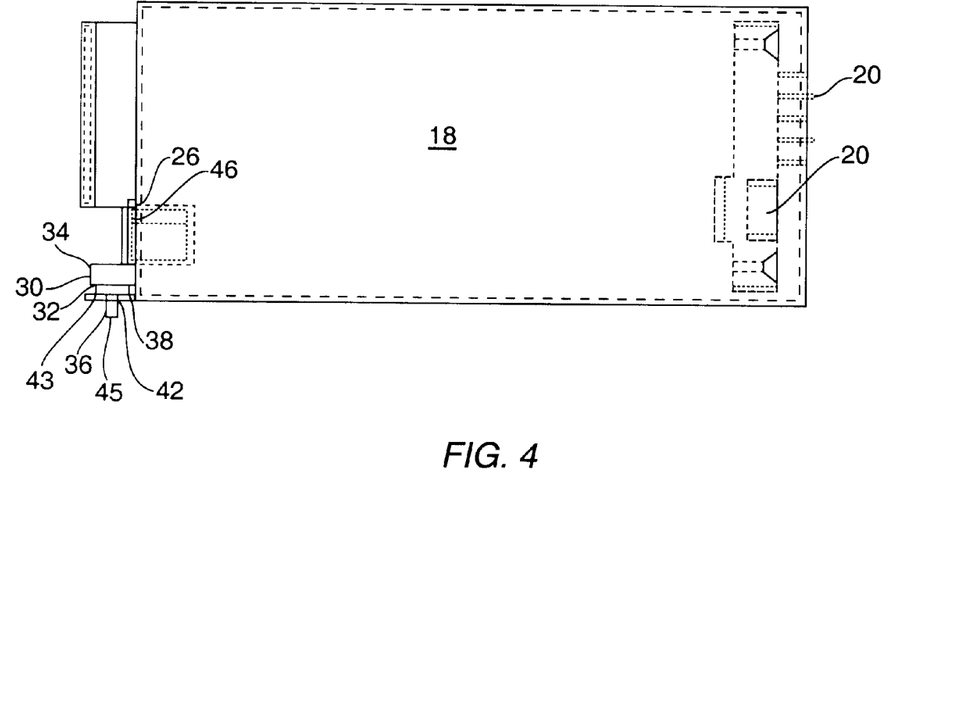
FIG. 4 is a side elevational view of a power supply and interlock member in a second position in accordance with a presently preferred embodiment of the present invention.
Figure 5:
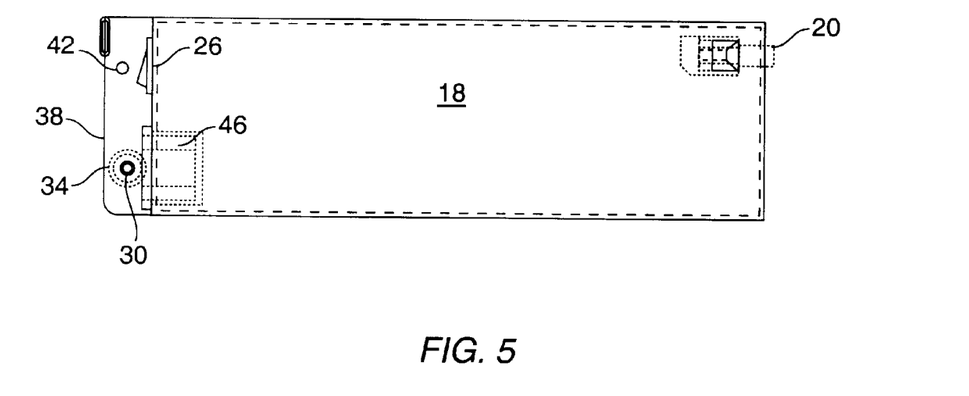
FIG. 5 is a top plan view of a power supply and interlock member in accordance with a presently preferred embodiment of the present invention.
Figure 7:
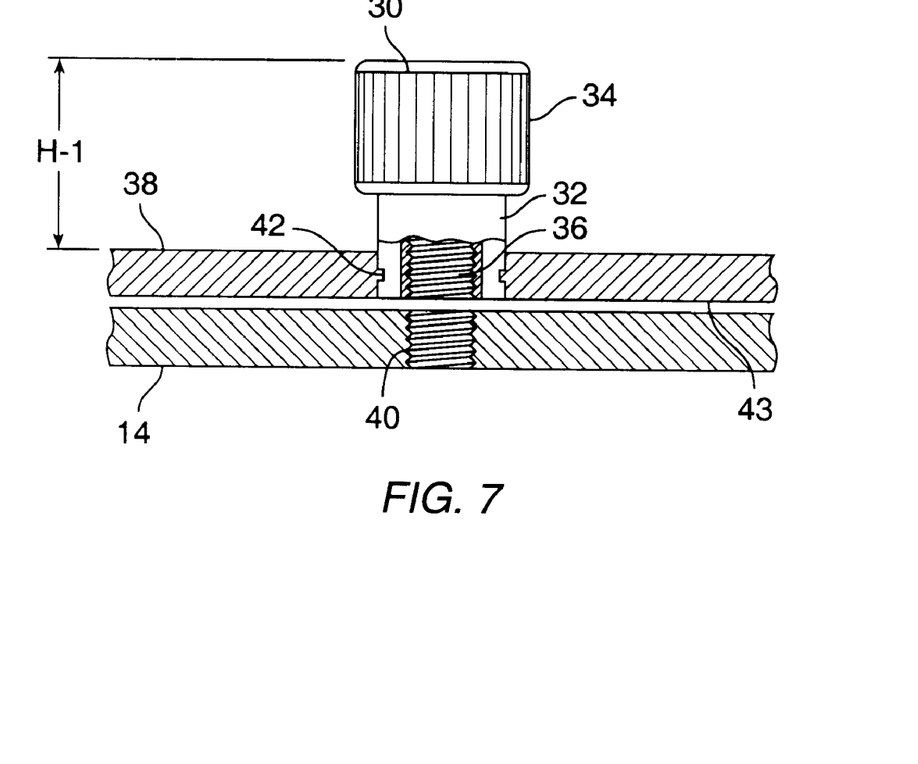
FIG. 7 is a fragmentary sectional view of an interlock member in the first position in accordance with a presently preferred embodiment of the present invention.
Figure 8:
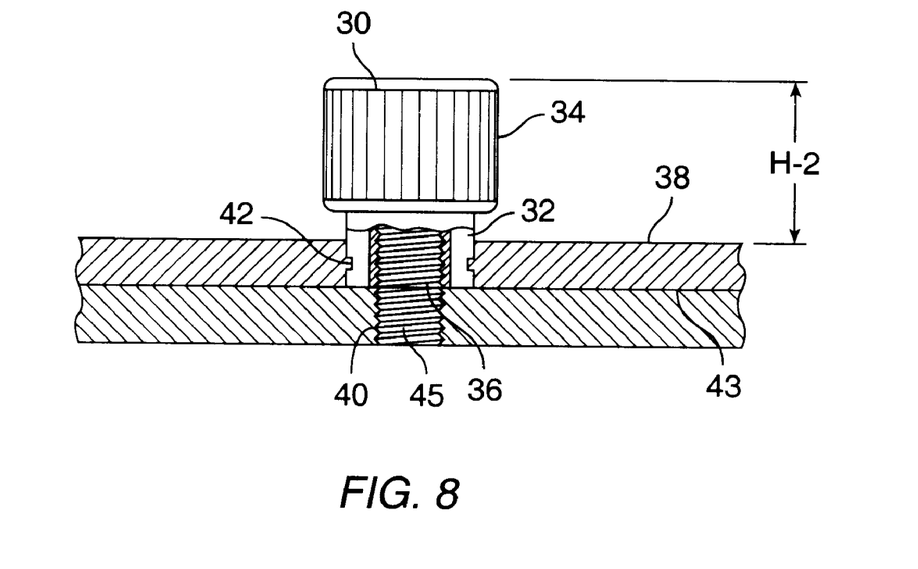
FIG. 8 is a fragmentary sectional view of an interlock member in the second position in a presently preferred embodiment of the present invention.

Thus, cap 34 retaining the screw 16 is movable between a first position, as shown in FIGS. 2 and 7, and a second position, as shown in FIGS. 3, 4, and 8. In the first position of the interlock member 30, the screw 36 is totally withdrawn from a lower surface 43 of the plate 38, and in the second position of the interlock member 30, an outer end 45 of the screw 36 projects from the lower surface 43 of the plate 38.

In the first position, the interlock member 30 is located in front of a socket 46 on the power supply and prevents attachment of a plug 48 of a power cord 28 to the socket 46 of the power supply 18. Since the spring biases the cap 34 to the first position, the interlock member 30 automatically prevents attachment of the plug 48 to the socket 46 until the interlock member 30 is manually placed in the second position. At this time, with the interlock member 30 located in the first position, the outer end 45 of the screw 36 does not project past the plate 38 of the power supply 18, and thus with the interlock member 30 in this first position, attachment of the power supply 18 to the back plane 24 of the electronic instrument 10 is permitted, such that the attachment procedure of the power supply 18 is necessarily carried out with the power cord 28 removed from the socket 46, thus assuring that power is removed from the power supply 18 during the attachment procedure.

However, if the power plug 48 is attached to the socket 46 during the attachment procedure of the power supply 18, the plug 48 obstructs the interlock member 30, and the interlock member 30 is automatically forced to the second position with the outer end 45 of the screw 36 projecting from the plate 38 of the power supply 18. The interlock member 30 then obstructs movement of the power supply 18 to the fully inserted position in the cavity 16, since the outer end 45 of the screw 36 interferes with an outer end 47 of the frame lower wall. Since the interlock member 30 is moved to the second position by the plug 48, the interlock member 30 thus automatically assures that the power supply 18 cannot be attached to the back plane 24 while the plug 48 is received in the socket 46. In this manner, the interlock member 30 prevents the possibility of the power supply 18 generating power while being attached to the back plane 24.

Further, if the attachment procedure of the power supply 18 has been successfully carried out with the power cord 28 removed from the power supply 18, then the power supply 18 is fully received in the cavity 16 of the frame 12, and the pair of screws 36 may be turned by a screw driver (not shown) or by hand until the outer ends 45 of the screws 36 are received in the threaded bores 40 in the lower wall of the frame 12 in order to secure the power supply 18 to the frame 12 at the correct position. In this manner, the interlock member 30 prevents the securing of the power supply 18 to the frame 12 until the power supply 18 is fully and completely attached to the electronic instrument 10. Thus, the interlock members 30 automatically assure a safe procedure for attachment of the power supply 18 to the electronic instrument 10, and subsequent securing of the power supply 18 to the frame 10.

When it is desirable to remove the power supply from the electronic instrument 10, the plug 48 must be removed from the socket 46 in order to provide access to the heads of the screws 36. Once done, the screws 36 may be removed from the threaded bores 40 in order to remove the power supply 18 from the frame 12, after which the interlock member 30 is automatically biased to its first position where it obstructs access to the socket 46, after which the power supply 18 may be removed from the electronic instrument 10 while the plug 48 is removed from the socket 46 to assure that power is removed from the power supply 18 during the removal of the power supply 18 from the electronic instrument 10. Thus in this manner, the interlock member 30 also assures that the power supply 18 is correctly removed from the electronic instrument 10 with the power supply not generating power.

Figure 9A:
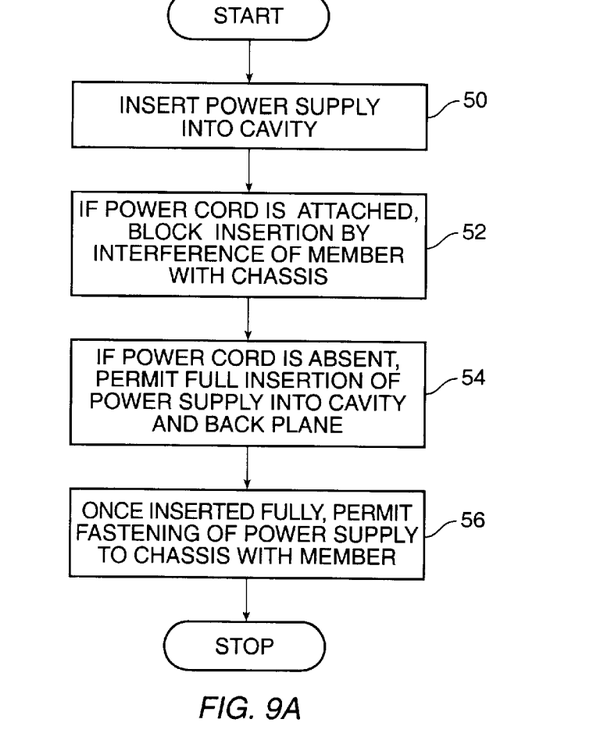
FIGS. 9A and 9B are flow charts showing a method of protecting an electronic instrument in accordance with a presently preferred embodiment of the present invention.

A method of protecting an electronic instrument 10 is illustrated in the flow chart of FIG. 9A. As shown in block 50, a power supply 18 is inserted into a cavity 16a, 16b of the electronic instrument 10. As shown in block 52, insertion of the power supply 18 is blocked by interference of the interlock member 30 with a chassis 12 of the electronic instrument 10 if the power cord 28 is attached to the power supply. As shown in block 54, full insertion of the power supply 18 into the cavity 16a, 16b and against a back plane 24 of the electronic instrument 10 is permitted if the power cord 28 is absent from the power supply 18. As shown in block 56, fastening of the power supply 18 to the chassis 12 with the interlock member 30 is permitted once the power supply 28 is fully inserted into the cavity 16a, 16b.

Figure 9B:
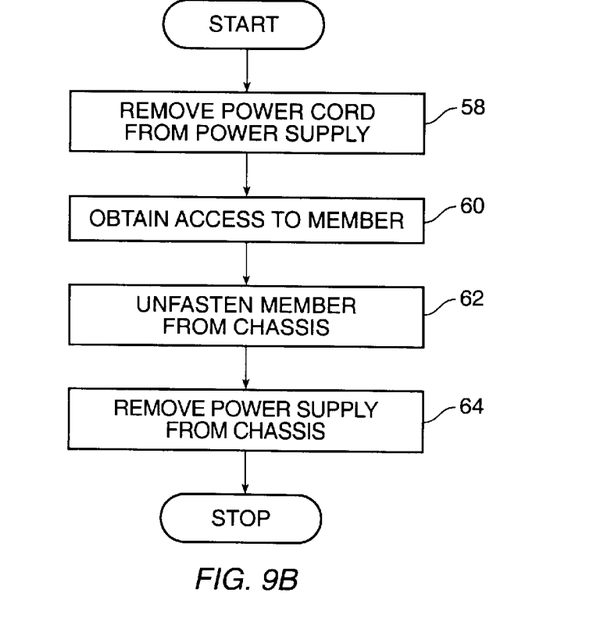

Another method of protecting an electronic instrument 10 is illustrated in the flow chart of FIG. 9B. As shown in block 58, a power cord 28 is removed from a power supply 18. As shown in block 60, access is obtained to an interlock member 30. As shown in block 62, the interlock member 30 is unfastened from a chassis 12 of the electronic instrument 10. Finally, as shown in block 64, the power supply 18 is removed from the chassis 12.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A protection device for an electronic instrument, comprising:
   a power supply;
   a power cord for attachment to said power supply; and
   an interlock member being movable between a first position preventing attachment of said power cord to said power supply, and a second position permitting attachment of said power cord to said power supply.

2. The device of claim 1 further comprising a device for biasing said interlock member from said second position to said first position.

3. The device of claim 1 further comprising a frame having a cavity to receive the power supply, in which the interlock member prevents full insertion of said power supply into the cavity when the interlock member is located at said second position, and in which the interlock member permits full insertion into said cavity when the interlock member is at said first position.

4. The device of claim 3 in which the interlock member secures the power supply to the frame when said interlock member is located at said second position and when said power supply is fully inserted into the cavity.

5. A protection device for an electronic instrument, comprising:
   a power supply having a first connection member;
   a power cord having a second connection member, such that said second connection member may be releasably connected to said first connection member to supply power to said power supply;
   a frame having a cavity to receive said power supply; and
   an interlock member being movable between a first position preventing attachment of said second connection member to said first connection member, and a second position preventing full insertion of said power supply into said cavity when said second connection member is attached to said first connection member.

6. The device of claim 5 wherein the first connection member comprises a socket, and in which the second connection member comprises a plug.

7. The device of claim 5 wherein the interlock member secures said power supply to the frame when said interlock member is at said second position and when the power supply is fully inserted into the cavity.

8. The device of claim 5 further comprising a device for biasing the interlock member from said second position to said first position.

9. A protection device for an electronic instrument, comprising:
   a frame having a plurality of walls defining a cavity;
   a power supply having a socket and being receivable in said cavity;
   a power cord having a plug removably connected to said socket; and
   an interlock member being movable between a first position obstructing attachment of the plug to the socket and permitting full insertion of said power supply into said cavity, and a second position when said plug is attached to said socket which obstructs full insertion of said power supply into said cavity, said interlock member securing said power supply to said frame when said interlock member is located at said second position and when said power supply is fully inserted into the cavity.

10. The device of claim 9 including a device for biasing said interlock member from said second position to said first position.

11. The device of claim 10 wherein said biasing device comprises a helical spring.

12. The device of claim 10 wherein the interlock member comprises a screw.

13. The device of claim 12 wherein said frame includes a plurality of walls defining the cavity, and in which one of the walls includes a threaded bore to receive the screw at said second position.

14. A protection device for an electronic instrument, comprising:
   a frame having a plurality of walls defining a cavity, and one wall having a threaded bore;
   a power supply having a socket, and a plate positioned adjacent said one wall when the power supply is inserted into said cavity, said plate having a second bore;
   a power cord having a plug for releasable connection to said socket;
   a threaded screw received in said second bore, said screw being movable between a first position preventing attachment of said plug to said socket and permitting full insertion of said power supply into the cavity, and a second position permitting connection of said plug to said socket, and obstructing movement of said plate totally past an end of said one wall with the power supply not fully inserted into said cavity, said screw being received in said threaded bore at said second position, with the power supply fully inserted into said cavity, and with said plug received in said socket; and
   a device for biasing said screw from said second position to said first position.

15. The device of claim 14 wherein the biasing device comprises a helical spring.

16. The device of claim 14 wherein the power supply is removably attached to a back plane of said frame when said power supply is fully inserted into said cavity.

17. A method of protecting an electronic instrument, comprising the steps of:

inserting a power supply into a cavity of the electronic instrument;

blocking insertion of the power supply if a power cord is attached to the power supply by interference of an interlock member with a chassis of the electronic instrument;

permitting full insertion of the power supply into said cavity and against a back plane of the electronic instrument if the power cord is absent from the power supply; and permitting fastening of the power supply to said chassis with the interlock member once the power supply is fully inserted into the cavity.

18. A method of protecting an electronic instrument, comprising the steps of:

removing a power cord from a power supply;

obtaining access to an interlock member;

unfastening the interlock member from a chassis of the electronic instrument; and removing the power supply from the chassis.

* * * * *